United States Patent [19]

Reid

[11] 4,296,456
[45] Oct. 20, 1981

[54] ELECTRONIC PACKAGE FOR HIGH DENSITY INTEGRATED CIRCUITS

[75] Inventor: Gilbert R. Reid, Norristown, Pa.

[73] Assignee: Burroughs Corporation, Detroit, Mich.

[21] Appl. No.: 155,533

[22] Filed: Jun. 2, 1980

[51] Int. Cl.[3] .............................................. H05K 1/14
[52] U.S. Cl. ................... 361/403; 174/52 S; 361/412; 361/421
[58] Field of Search ............... 361/403, 412, 421, 404; 174/52 S

[56] References Cited

U.S. PATENT DOCUMENTS

| | | | |
|---|---|---|---|
| 3,337,678 | 8/1967 | Stelmak | 174/52 S |
| 3,354,394 | 11/1967 | James | 361/403 X |
| 3,374,537 | 3/1968 | Doelp | 361/421 X |
| 3,550,766 | 12/1970 | Nixen | 361/421 X |
| 3,676,748 | 7/1972 | Kobayashi et al. | 361/421 |
| 3,701,964 | 10/1972 | Cronin | 361/412 X |
| 3,760,090 | 9/1973 | Fowler | 174/52 S |
| 3,781,596 | 12/1973 | Galli | 361/421 X |
| 3,809,797 | 5/1974 | McMunn | 174/52 S X |
| 4,164,003 | 8/1979 | Cutchaw | 361/403 |
| 4,225,900 | 9/1980 | Ciccio | 361/403 X |

OTHER PUBLICATIONS

Holsopple et al., Increased Useable I/O Pins on a Substrate, IBM Tech. Disc. Bull., v. 23 #7A, Dec. 1980, pp. 2716 & 2717.
Caccoma et al., Standardized Mulilayer Pin-Lead Frame Contactor, IBM Tech. Disc. Bull., v. 16 #3, Aug. 1973, pp. 991 & 992 relied on.

Primary Examiner—Richard R. Kucia
Attorney, Agent, or Firm—Francis A. Varallo; E. M. Chung; K. R. Peterson

[57] ABSTRACT

The present disclosure describes a multi-layered integrated circuit package especially suited for high density circuit applications, such as those involving LSI or ULSI. The package is characterized by short uninterrupted electrical circuit paths between the integrated circuit chip and an interconnection medium. The use of metallized vias or feed-throughs commonly employed in multi-layered packages have been eliminated. Also, heat dissipation is enhanced by the short thermal path between the chip and the outer package surface. Finally, the signal lead configuration permits the area occupied by the package on the interconnection medium to be significantly less than that of present-day packages having approximately the same number of input/output pins or terminals.

7 Claims, 4 Drawing Figures

4,296,456

ELECTRONIC PACKAGE FOR HIGH DENSITY INTEGRATED CIRCUITS

BACKGROUND OF THE DISCLOSURE

An ever increasing need exists for electronic packages to house high density integrated circuit chips such as those employing large scale and ultra-large scale integration. Such packages must necessarily employ short signal paths to permit high speed operation and must have good thermal characteristics to handle the increased power requirements. At the same time, the packages must be reliable, and this is due in large measure to the internal signal path configuration and the ease with which such paths may be fabricated.

The integrated circuit package described hereinafter meets all of the foregoing criteria.

SUMMARY OF THE INVENTION

In accordance with the present invention, an improved multi-layered integrated circuit package is provided. The package includes a base member, preferably of ceramic or metal, upon which are mounted a plurality of circuit layers. The latter may be of ceramic or of the printed circuit board variety, depending upon the application. Each of the circuit layers has a generally frame-like configuration, with a central opening. In the absence of metallized vias, a substantial portion of the planar surface of each layer is available for the screening of signal and buss lines. The lines originate at electrically conductive tabs disposed along the periphery of the central opening for receiving wires bonded to the integrated circuit chip. From the tabs, the lines traverse the surface of the layer in various directions for a predetermined distance and terminate at electrically conductive pads adapted to have affixed thereto respective pins or terminals. It should be noted that even heavy or wide voltage and ground path lines needed for the high currents present in LSI and ULSI applications are easily provided.

In fabricating the package, the plurality of circuit layers are stacked symmetrically one on the other commencing with the base. However, the active surface area covered by each succeeding layer allows the chip wire tabs and the terminal mounting pads of the preceding layer to remain accessible. That is, all the pins associated with metallized lines on the surface of a given circuit layer are connected directly to the pads on that layer. No metallized vias or feed-throughs are required to establish a signal path from one circuit layer to a pin mounted on a conductive pad on another circuit layer.

In providing the last mentioned configuration, a package comprised of a rectangular ceramic base and ceramic circuit layers may resemble an initial pyramidal structure. Thus, the succeeding circuit layers exhibit a decreasing surface area and an increasing central opening, which may also be rectangular. This permits the chip connection tabs and the terminal mounting pads of all the circuit layers to be accessible.

Alternately, particularly with circuit layers of the printed circuit board variety, the overall dimensions of the circuit layers may be substantially the same. However, the central apertures of succeeding layers should be larger for the reason noted hereinbefore and comparatively large non-metallized apertures must be provided in each layer to permit access to the pin mounting pads on the preceding layer.

The integrated circuit chip is mounted on the base within the well created by the respective central openings of the circuit layers and the signal pads on the chip periphery are connected to respective tabs on the circuit layers, as required.

Finally, a seal ring may be attached to the outermost circuit layer, and a cap or lid mounted thereon, to protect the chip.

The present package possesses a number of advantages. It provides short electrical paths from the chip through a pin to the interconnection board or medium. The elimination of metallized vias and feed-throughs increases the package reliability, and fewer solder or welded connections are required. The package permits a large number of input/output pins. At the same time, it occupies considerably less area on the interconnection board compared to present-day packages with comparable numbers of pins. Also, the package exhibits good thermal characteristics because of the short heat flow path from the integrated circuit chip to the plane surface of the package.

Other features and advantages of the electronic package of the present invention will become apparent in the detailed description which follows.

DESCRIPTION OF THE PREFERRED EMBODIMENTS

Figure 1:
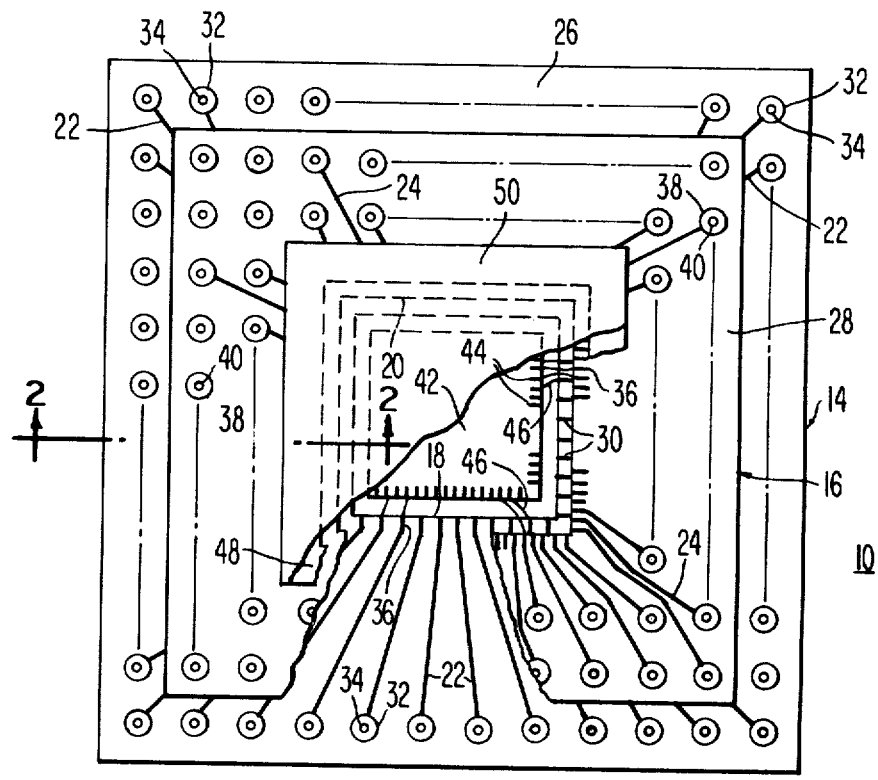
FIG. 1 is a bottom view of an embodiment of the package of the present invention, illustrated with portions of the uppermost circuit layer and the protective lid cut away.

FIG. 1 is a bottom view of an embodiment of the integrated circuit package 10 of the present invention. With reference to FIG. 1, and the section view of FIG. 2 derived therefrom, the package 10 is of multilayer ceramic construction, and includes a base 12, and a plurality of circuit layers 14 and 16 stacked and mounted one on the other utilizing well known ceramic processes. The layers 14 and 16 are generally frame-like, with respective central openings 18 and 20. Pluralities of metallized lines 22 and 24 have been screened onto the respective planar surfaces 26 and 28 of the circuit layers 14 and 16. The lines 22 on layer 14 originate respectively at a plurality of electrically conductive tabs 30 disposed along the periphery of its central opening 18, and terminate at electrically conductive pads 32 to which are affixed input/output pins 34. Similarly lines 24 on the outer circuit layer 16 extend from tabs 36 to pads 38, the latter having pins 40 attached thereto. It is apparent that all input/output pins 34 associated with the lines 22 on layer 14 are affixed only to pads 32 on that layer. The same is true for pins 40 associated with lines 24 on layer 16. Hence, there is no need for metallized vias or feed-throughs to conduct signals from one circuit layer to another.

In fabricating the package 10, the first circuit layer 14 is bonded to the base 12 and the second layer 16 is bonded to the first layer 14 in a symmetrical fashion. While two circuit layers have been illustrated for purposes of example, the package of the present invention should not be considered restricted to that number. As clearly seen in FIGS. 1 and 2, the overall dimensions of the circuit layer 16 are smaller than those of layer 14, while its central opening 20 is larger than that of opening 18 of layer 14. This arrangement produces a somewhat pyramidal configuration which permits the pads 32 and tabs 30 on the first layer 14 to be accessible after the second layer 16 has been stacked thereupon. Each succeeding layer, if present, would follow this configuration.

An integrated circuit chip 42 is mounted on the inner surface of the base 12, within the well created by the contiguous central openings 18 and 20 of the circuit layers. The signal pads 44 on the chip periphery are connected, respectively, by wires 46 to the tabs 30 and 36 on both layers.

A metallized seal ring 48 attached to the outer layer 16, provides the means for mounting a cap or lid 50 which will protect the chip 42.

Figure 2:
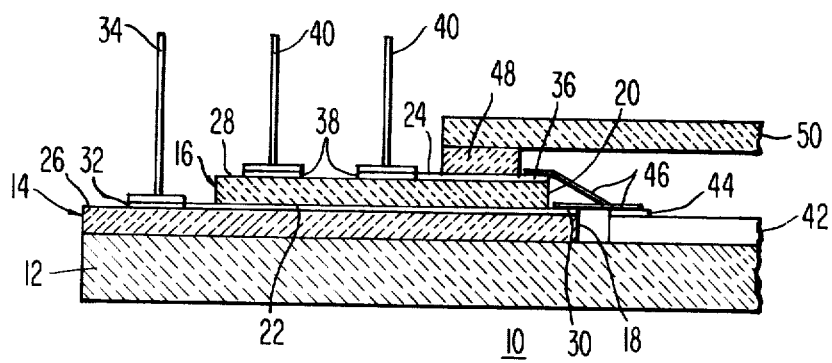
FIG. 2 is a section view of the package taken along lines 2—2 of FIG. 1.
Figure 3:
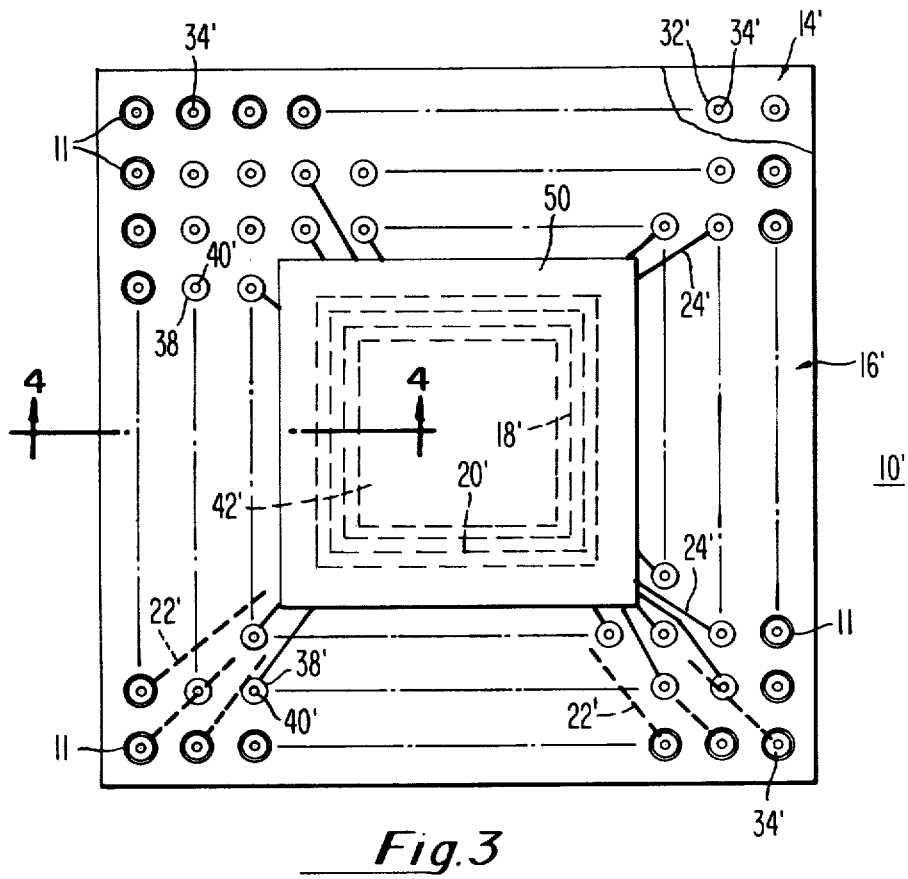
FIG. 3 is a bottom view of another embodiment of the package of the present invention.
Figure 4:
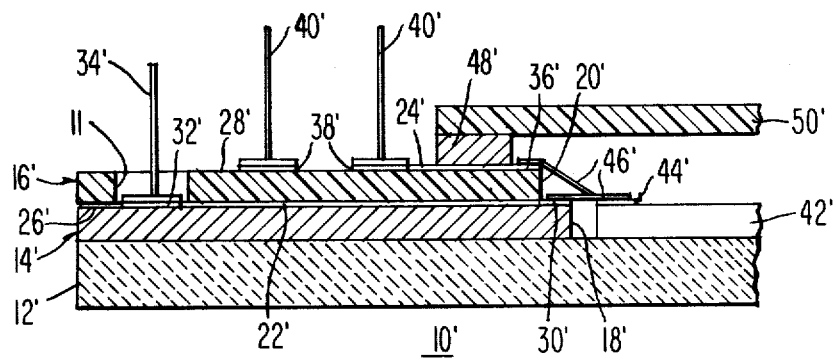
FIG. 4 is a section view of the package of FIG. 3 taken along lines 4—4 thereof.

FIG. 3 depicts the bottom of another embodiment of the package 10' taught by the present invention. With reference to FIG. 3 and its corresponding section view FIG. 4, the base 12' is formed of ceramic or metal. A pair of circuit layers 14' and 16' of the printed circuit board variety are stacked upon the base 12' and each other. The lower layer 14' may be affixed to the base 12' with an adhesive, while the second layer 16' is fastened to the first layer 14' with an insulating adhesive. The layers 14' and 16' contain on their respective planar surfaces 26' and 28', printed wires or lines 22' and 24'. The lines 22' on layer 14' connect electrically conductive tabs 30' to pads 32'. Similarly, lines 24' on layer 16' connect tabs 36' to pads 38'. The circuit layers 14' and 16' also contain respective central openings 18' and 20'. As in the package of FIGS. 1 and 2, the opening 20' is larger in layer 16' compared to opening 18' of layer 14' to permit access to the tabs 30' of the latter. However, while the active surface area of layer 16' is less than that of layer 14', as in the case of package 10 in FIGS. 1 and 2, the overall dimensions of the layers 14' and 16' are substantially the same. This allows for greater ease of fabrication. In order to provide access to the pads 38' for mounting pins 40', layer 16' contains a plurality of non-metallized apertures 11 homologously arranged with respect to the pads 32' on the lower layer 14'. The pins 34' are then affixed to the pads 32' after passing their mounting heads through apertures 11. Pins 40' are also affixed directly to the pads 38' on outer layer 16'. If desired, the pins 34' and 40' may be of the same length, so that when mounted on the two layers 14' and 16', those on the outer layer will extend out further from the package base than those on the inner layer. The unequal pin lengths aid the insertion of the package into the interconnection medium, not shown.

As in package 10, the integrated circuit chip 42' is mounted on base 12', within the central apertures 18' and 20' of the circuit layers. Wires 46' connect its peripheral pads 44' to tabs 30' and 36' on the last mentioned layers. A metallized seal ring 48' is mounted on the surface of the outer layer 16'. and a lid 50' is bonded to the ring 48' to serve as a protective cover for the chip 42'.

The integrated circuit package 10 illustrated in FIGS. 1 and 2 is approximately 30.5 mm. (1.2 inches) square, contains 108 pins and has circuit layers which are each approximately 0.254 mm. (0.01 inches) thick. Utilizing the inventive techniques taught herein, a 35.6 mm. (1.4 inch) square package would accommodate 160 pins; while a 40.6 mm. (1.6 inch) square package might have 220 pins. It should be understood that the foregoing dimensions are included solely for purposes of example and are not to be considered limitative of the invention. The present package may be produced in various sizes and pin counts depending upon the application.

In conclusion, there has been disclosed an integrated circuit package well suited for high speed, large circuit density applications. The length of the electrical circuit path from the chip, through the pin to the interconnection medium, has been minimized. Likewise the package sizes mentioned hereinbefore occupy considerably less space on the interconnection medium compared to present-day packages with like numbers of input/output pins. It is apparent that the invention takes advantage of multilayer ceramic techniques, while eliminating the fabrication difficulties and unreliability of circuit connections frequently attendant with metallized vias. The dissipation of heat is accomplished in a straightforward manner, without increasing package complexity. It should be apparent that depending upon the particular application, changes and modifications of the package may be required. Such changes and modifications, insofar as they are not departures from the true scope of the invention, are intended to be covered by the following claims.

What is claimed is:

1. An electronic package for an integrated circuit chip having a plurality of signal pads along its periphery comprising:

a base member and at least a first and a second circuit layer, said first circuit layer being mounted on said base member and said second circuit layer being mounted on said first circuit layer, each of said circuit layers being frame-like and having a central opening, a plurality of electrically conductive chip-connection tabs disposed on a planar surface of each of said circuit layers and situated adjacent the periphery of its central opening, respective pluralities of electrically conductive pin-mounting pads and metallized lines disposed on said planar surface of each of said circuit layers, each of said lines connecting a chip-connection tab to a pin-mounting pad on a common circuit layer;

the dimensions of the central opening of said second circuit layer being greater than those of the central opening of said first circuit layer, and the area of the planar surface of said second circuit layer being less than that of said first circuit layer, whereby the chip-mounting tabs and the pin-mounting pads of said first circuit layer remain uncovered in the presence of the mounted second circuit layer;

a plurality of input/output pins affixed respectively to the plurality of pin-mounting pads on each of said circuit layers;

the central openings of said circuit layers forming a well for receiving said chip, the latter being adapted to be mounted on said base member and to have said signal pads connected respectively to said chip-connection tabs on both said first and second circuit layers.

2. An electronic package as defined in claim 1 characterized in that the overall dimensions of said first circuit layer are substantially the same as those of said base member and the overall dimensions of said second layer are less than those of said first circuit layer, the respective geometrical centers of said base member and said first and second layers being in substantial alignment along a common axis.

3. An electronic package as defined in claim 1 further characterized in that the respective overall dimensions of said first and second circuit layers and said base member are substantially the same, said second circuit layer having a plurality of apertures homologously disposed with respect to the pin-mounting pads of said first circuit layer and permitting access thereo.

4. An electronic package as defined in claim 2 characterized in that said base member and said first and second circuit layers are formed of ceramic.

5. An electronic package as defined in claim 3 characterized in that said base member is formed of a thermally conductive material and said first and second circuit layers are printed circuit boards.

6. An electronic package as defined in claims 2 or 3 further including a metallized seal ring mounted on said second circuit layer alongside the chip-connection tabs on said last mentioned layer, and a lid disposed on said ring for providing protection for said chip.

7. An electronic package as defined in claim 6 wherein said base member, said first and second circuit layers and their respective central openings are all rectangular in form.

* * * * *